United States Patent
Lee et al.

(10) Patent No.: US 7,264,983 B2
(45) Date of Patent: Sep. 4, 2007

(54) METHOD OF ENHANCING CONNECTION STRENGTH FOR SUSPENDED MEMBRANE LEADS AND SUBSTRATE CONTACTS

(75) Inventors: Tzong-Sheng Lee, Hsinchu (TW); Jing-Hung Chiou, Taipei Hsien (TW); Jeng-Long Ou, Hsinchu Hsien (TW)

(73) Assignee: UniMEMS Manufacturing Co., Ltd., Hsinchu (TW)

( * ) Notice: Subject to any disclaimer, the term of this patent is extended or adjusted under 35 U.S.C. 154(b) by 343 days.

(21) Appl. No.: 10/980,226

(22) Filed: Nov. 4, 2004

(65) Prior Publication Data
US 2006/0094150 A1    May 4, 2006

(51) Int. Cl.
*H01L 21/00* (2006.01)
(52) U.S. Cl. .................... 438/48; 438/53; 438/57; 257/E21.001
(58) Field of Classification Search ............ 438/48, 438/53, 57
See application file for complete search history.

(56) References Cited

U.S. PATENT DOCUMENTS 5,521,123 A * 5/1996 Komatsu et al. ............... 438/64
6,465,784 B1 * 10/2002 Kimata ........................ 250/332
6,552,344 B1 * 4/2003 Sone et al. ............... 250/338.1

* cited by examiner

*Primary Examiner*—Thanh Nguyen

(57) ABSTRACT

A method to enhance the connection strength of suspended membrane leads and substrate contacts is described. A reading circuit chip is provided and a sacrificial layer is formed thereon. Subsequently, an electrical contact window is created in the sacrificial layer to expose a conductive layer of the reading circuit chip. A metal layer is filled into the contact window and a conductive membrane is formed thereon to couple electrically to the metal layer. Afterward, an infrared measuring membrane and an upper dielectric layer are formed thereon.

18 Claims, 4 Drawing Sheets

METHOD OF ENHANCING CONNECTION STRENGTH FOR SUSPENDED MEMBRANE LEADS AND SUBSTRATE CONTACTS

FIELD OF THE INVENTION

The present invention generally relates to a method of enhancing connection strength for suspended membrane leads and substrate contacts. More particularly, this invention relates to a method of enhancing connection strength for suspended membrane leads and substrate contacts of thermal type infrared sensors.

BACKGROUND OF THE INVENTION

Due to rapid progress in the semiconductor industry and in electronic technologies, technologies for manufacturing infrared measuring sensors have also progressed significantly. Infrared measuring sensors not only apply to the medical purpose of measuring body temperature but also apply to scientific, commercial and military purposes, such as laser detection, missile guidance, infrared spectrometry, remote control, burglarproofing equipment and thermal image detection. Conventionally, infrared measuring sensors include thermal type infrared measuring sensors and photon type infrared measuring sensors. Since the thermal type infrared measuring sensor is utilized more conveniently, it is widely used in various applications.

Generally speaking, the thermal type infrared sensors are further classified into thermocouple infrared sensors, pyroelectric infrared sensors, and microbolometers. The thermocouple infrared sensor, also named a thermopile infrared sensor, is constructed of a plurality of series-wound thermocouples. Hot junctions thereof are arranged on a suspended membrane and cold junctions are coupled to a substrate. Leads between the suspended membrane and the substrate include a series of thermocouples, and therefore the leads are normally wide and short.

The microbolometer utilizes a thermal measuring membrane with a high temperature coefficient of resistance (TCR) to act as the suspended infrared measuring membrane on the substrate of a reading circuit chip. At least two leads support the suspended measuring membrane on the substrate, and electrical signals measured by the suspended measuring membrane are transmitted to the substrate by the leads for reading and processing the electrical signals by electric circuits on the substrate. The pyroelectric infrared sensor utilizes a pyroelectric material to act as the suspended measuring membrane. The leads of the suspended measuring membranes of the microbolometer and the pyroelectric infrared sensor must be few in quantity, long, narrow and thin to reduce thermal conductance thereof and still be strong enough to maintain solid connections.

However, residual stress exists in the suspended membrane and in the leads thereof as a result of the manufacturing processes. The residual stress can press hard upon the structure and especially at some structural connections. The structural connections are often manufactured of different materials and by different processes, and therefore, their mechanical strength is relatively weak. If the residual stress is larger than the junction strength of the connections, the connections may break. The leads must extend from the suspended membrane down to a conductive layer surface of the reading circuits in the substrate. However, the conductive membrane of the lead is very thin and therefore the mechanical strength of the connections are very weak.

SUMMARY OF THE INVENTION

One object of the present invention is to provide a method to enhance the connection strength for connecting suspended membrane leads on the substrate contacts so as to enhance the connection strength between the infrared measuring membrane leads and the reading circuits in the substrate.

Another object of the present invention is to provide a method to enhance the connection strength for connecting suspended membrane leads on the substrate contacts so as to increase the yield of manufacturing infrared sensors.

The present invention provides a method to enhance the connection strength for suspended membrane leads and substrate contacts. The method includes the following steps. First, a reading circuit chip is provided. Then, a sacrificial layer is formed on the reading circuit chip, and an electrical contact window is formed in the sacrificial layer to expose a conductive layer on the reading circuit chip. Subsequently, the electrical contact window is filled with a metal layer. Thereafter, a conductive membrane is formed on the metal layer to electrically couple it to the metal layer.

Next, an infrared measuring membrane is formed on the conductive membrane, and a top dielectric layer is formed on the infrared measuring membrane. The infrared measuring membrane is patterned, and a portion of the infrared measuring membrane above the electrical contact window is preserved. While patterning the top dielectric layer, a portion of the top dielectric layer above the infrared measuring membrane and the electrical contact window is also preserved to protect the infrared measuring membrane above the electrical contact window.

The method further includes forming a bottom dielectric layer before forming the infrared measuring membrane. An etching window through the top dielectric layer and the bottom dielectric layer to expose the sacrificial layer is utilized to etch the sacrificial layer so as to suspend the suspended membrane. The sacrificial layer is preferably made of polyimide and the metal layer is preferably filled into the electrical contact window by electroless plating a metal material such as nickel.

The method of enhancing the connection strength according to the present invention can effectively improve the connection strength of the suspended membrane leads and substrate contacts of the reading circuit chip so that the electrical connections between the suspended membrane leads and contacts in the substrate can be improved. Due to preserving the top dielectric layer and the infrared measuring membrane above the electrical contact window, the connection strength of the suspended membrane leads and substrate contacts are further improved. Accordingly, the method of enhancing the connection strength according to the present invention can improve the manufacturing yield of the thermal type infrared sensor and particularly of the microbolometer.

BRIEF DESCRIPTION OF THE DRAWINGS

The foregoing aspects and many of the attendant advantages of this invention will be more readily appreciated as the same becomes better understood by reference to the following detailed description, when taken in conjunction with appropriate reference to the accompanying drawings, wherein.

DETAILED DESCRIPTION OF THE PREFERRED EMBODIMENT

The following description is of the best presently contemplated mode for carrying out the present invention. This description is not to be taken in a limiting sense but is made merely for the purpose of describing the general principles of the invention. The scope of the invention should be determined with reference to the appended claims.

Figure 1:
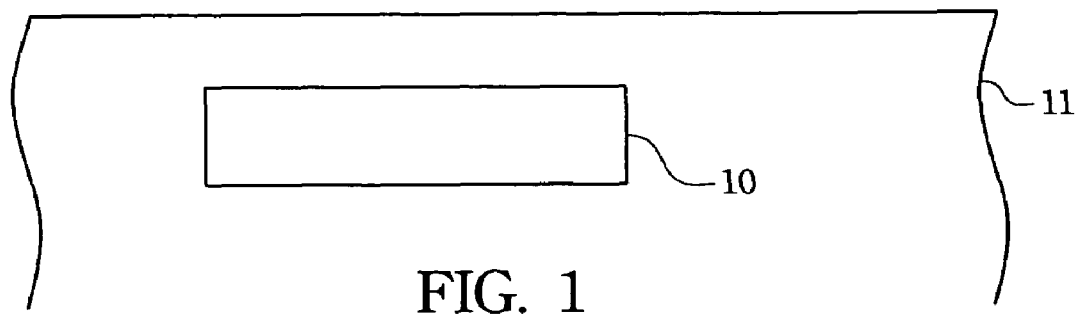
FIGS. 1~10 are cross-sectional views illustrating the steps of the method of enhancing the connection strength between the suspended membrane leads and substrate contacts of a reading circuit chip.

FIGS. 1~10 are schematic cross-sectional views illustrating the steps of the method of enhancing the connection strength between the suspended membrane leads and substrate contacts of a reading circuit chip. The method is illustrated with a thermal type infrared sensor and a reading circuit chip thereof. Referring to FIG. 1, a conductive layer 10 such as aluminum or an aluminum alloy, e.g. aluminum-copper or aluminum-silicon-copper, and a dielectric layer 11 for protecting the reading circuit chip are sequentially formed on the reading circuit chip.

Figure 2:
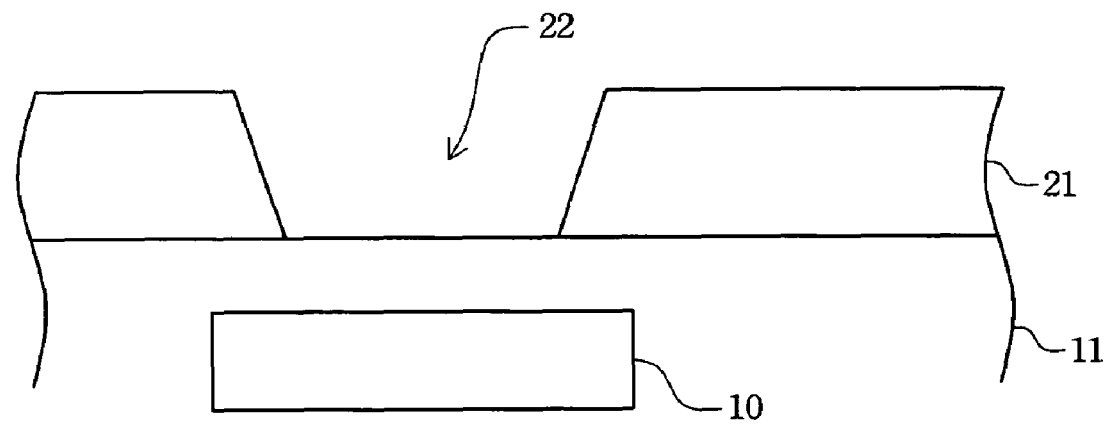
Figure 3:
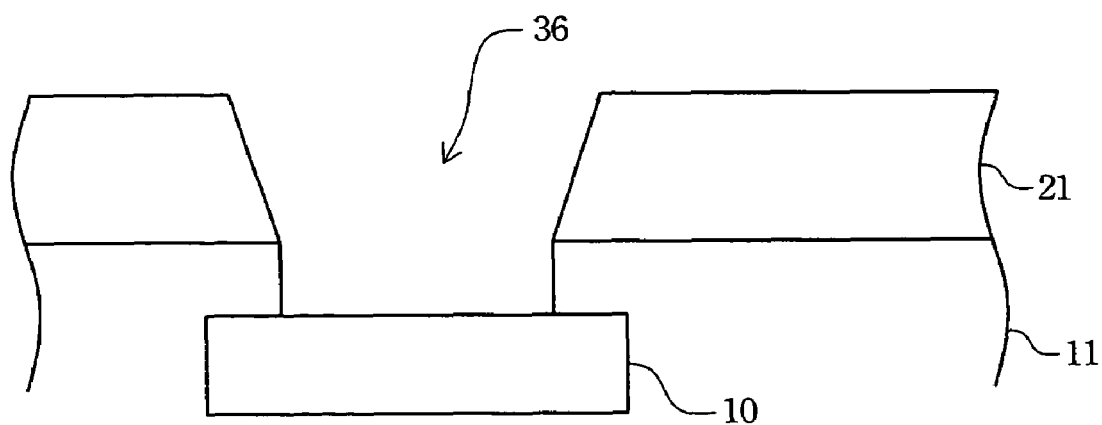
Figure 4:
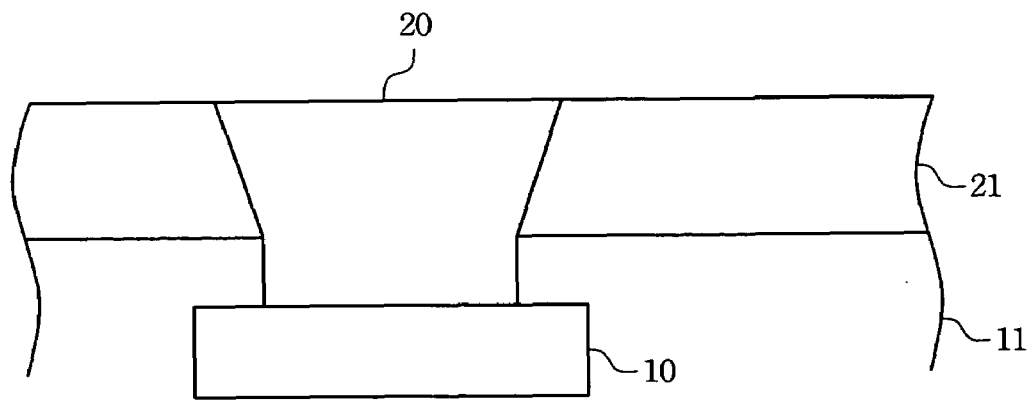

Referring to FIG. 2, a sacrificial layer 21, e.g. a polyimide layer, is formed on the dielectric layer 11. The sacrificial layer 21 includes an opening 22 above the conductive layer 10. Referring to FIG. 3, the dielectric layer 11 is etched via the opening 22 through to the conductive layer 10. Therefore, an electrical contact window 36 for the reading circuit to be electrically connected to leads of an infrared measuring membrane is formed. Referring to FIG. 4, the electrical contact window 36 is filled with a metal layer 20 until the level of the metal layer 20 is about that of the sacrificial layer 21.

The metal layer 20 preferably fills the electrical contact window 36 by an electroless plating technology using a metal such as nickel, copper, or any other conductive metal. However, the method of enhancing the connection strength between suspended membrane leads and substrate contacts according to the present invention is not limited to the electroless plating technology, and any other technology, such as deposition or sputtering, that can fill the electrical contact window 36 with conductive metal can be utilized in the present invention.

Figure 5:
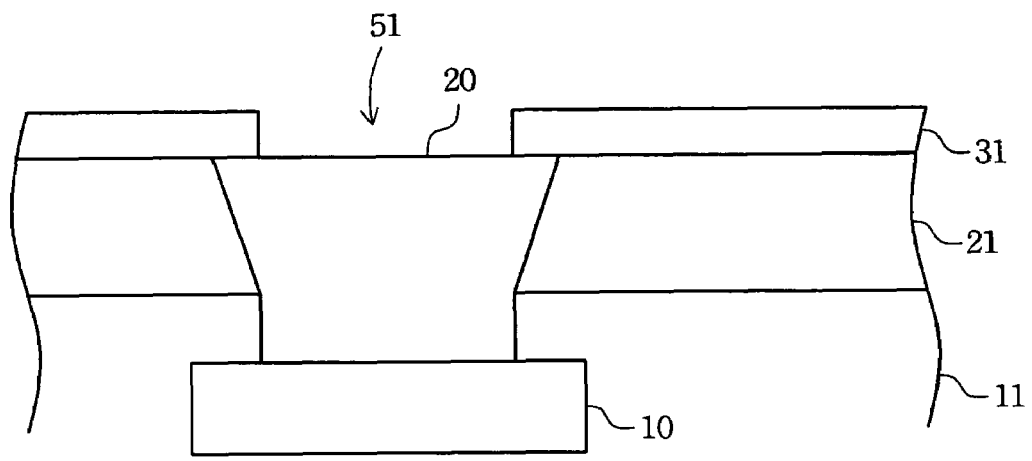
Figure 6:
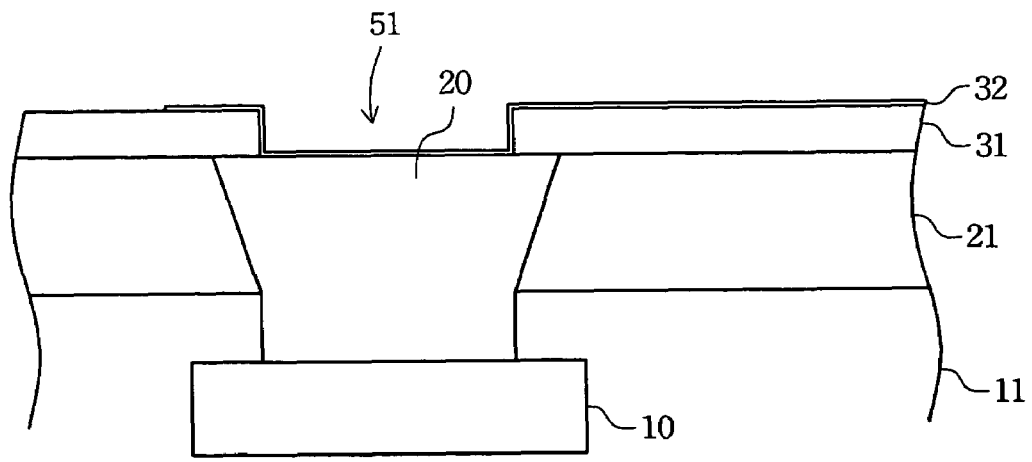

Referring to FIG. 5, the dielectric layer 31 is subsequently formed on the sacrificial layer 21 as a bottom dielectric layer 31. The bottom dielectric layer 31 includes an opening 51 above the electrical contact window 36. Referring to FIG. 6, a conductive membrane 32 is formed for electrically connecting a suspended infrared measuring membrane to the reading circuit.

Figure 7:
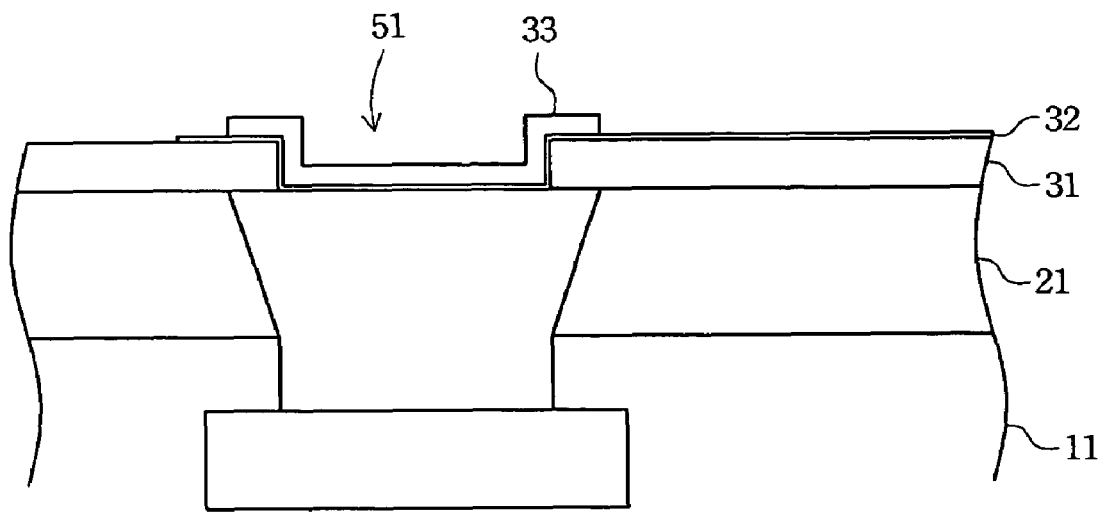
Figure 8:
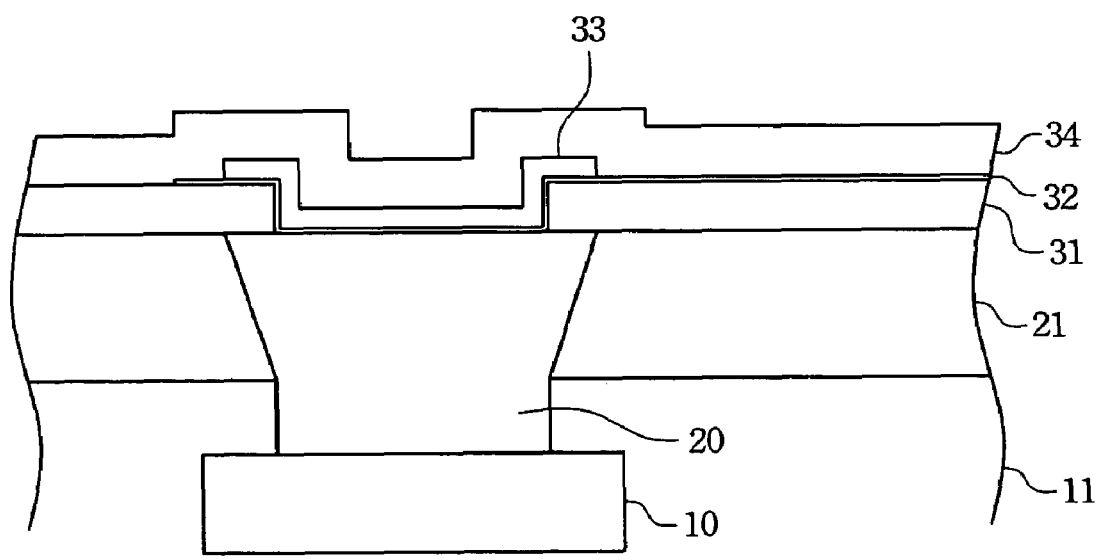
Figure 9:
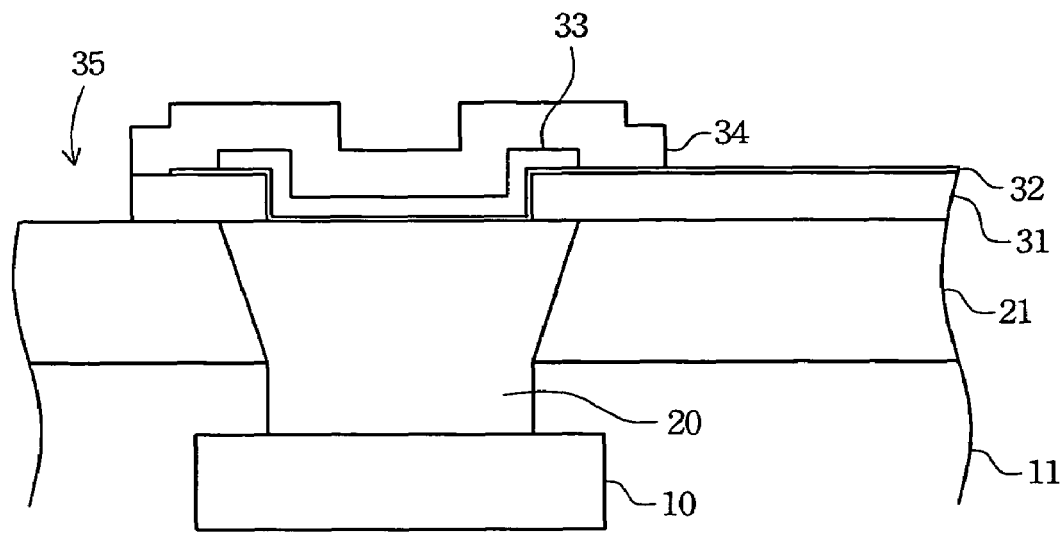
Figure 10:
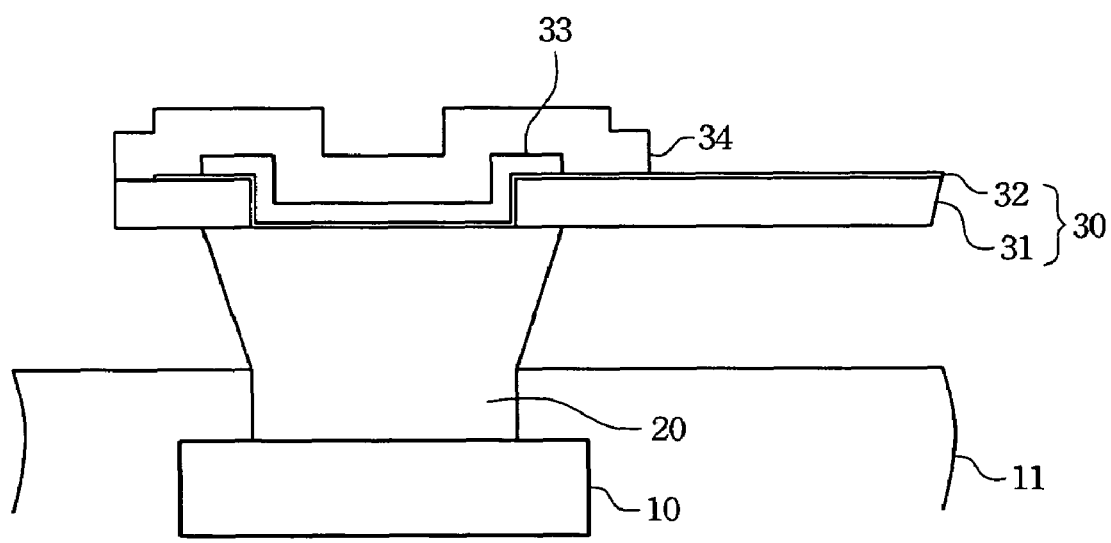

Referring to FIG. 7, an infrared measuring membrane 33 is formed and patterned on the conductive membrane 32, and a portion of infrared measuring membrane 33 above the electrical contact window 36 is specifically preserved. Referring to FIG. 8, a dielectric layer 34 is formed thereon to protect the infrared measuring membrane 33. Referring to FIG. 9, a connection area for the leads of the suspended membrane is defined and an etching window 35 for removing the sacrificial layer 21 is opened. Referring to FIG. 10, via the etching window 35, the sacrificial layer 21 is removed so as to suspend the suspended membrane leads 30. The conductive membrane 32 of the suspended membrane leads 30 can electrically couple to the conductive layer 10 of the reading circuit of the chip by way of the metal layer 20. Therefore, the conductive membrane 32 does not need to go deep into the electrical contact window 36 directly to connect with the conductive layer 10. Accordingly, the strength of the suspended membrane leads 30 is improved so that the electrical connection quality is improved.

For manufacturing a conventional thermal type focal plan array infrared sensor, reading circuits are first formed on a substrate and a dielectric layer is formed thereon to protect the reading circuits. Subsequently, a micro-electro-mechanical-system (MEMS) infrared measuring structure is formed thereon. For manufacturing the MEMS infrared measuring structure, a sacrificial layer is formed on the reading circuits and electrical contact windows are created in the sacrificial layer and the substrate to expose a conductive layer in the reading circuits in the substrate. However, a depth of the electrical contact window is larger than a thickness of a conductive membrane of the MEMS infrared measuring structure. Therefore, the conductive membrane has to go deep into the electrical contact window to contact the conductive layer of the reading circuits in the substrate. This results in poor quality of electrical connections between leads of the conductive membrane and the conductive layer of the reading circuits and thus a reduced mechanical strength of the conductive membrane.

For solving the foregoing conventional thermal type focal plan array infrared sensor problems, the present invention effectively enhances the connection strength between suspended membrane leads and substrate contacts for the thermal type focal plan array infrared sensor. The method of enhancing the connection strength according to the present invention fills the electrical contact window with a metal layer, such as that done by an electroless plating process using a metal material therein, prior to forming the conductive membrane. The metal layer, e.g. about a 2 μm-thick nickel layer, fills the entire electrical contact window and connects to the conductive layer exposed in the substrate. Therefore, connection positions of the suspended membrane leads and the reading circuits are elevated to an upper portion of the electrical contact windows so as to enhance the mechanical strength between the suspended membrane leads and the substrate and also improve the electrical connection quality therebetween.

The microbolometer normally utilizes a VOx material to form a required infrared measuring membrane by way of etching. The present invention further reserves the infrared measuring membrane above the connection areas of the suspended membrane leads on the substrate to further enhance the connection strength thereof. Accordingly, the suspended membrane leads are composed of not only the conductive membrane, about 600 Å~900 Å in thickness, but also the infrared measuring membrane, about 1 kÅ in thickness. Therefore, the mechanical strength of the leads and the substrate contact can be enhanced and the electrical connection quality therebetween can also be improved. The present invention further reserves the dielectric layer on the infrared measuring membrane above the connection areas for protecting the infrared measuring membrane and further increases the mechanical strength of the suspended membrane leads.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A method of enhancing connection strength of suspended membrane leads and substrate contacts, comprising:

providing a reading circuit chip;

forming a sacrificial layer on the reading circuit chip;

forming an electrical contact window in the sacrificial layer to expose a conductive layer of the reading circuit chip;

filling the electrical contact window with a metal layer;

forming a conductive membrane to couple to the metal layer;

forming an infrared measuring membrane on the conductive membrane; and forming a top dielectric layer on the infrared measuring membrane.

2. The method of claim 1, further comprising:

patterning the infrared measuring membrane and preserving a portion of the infrared measuring membrane above the electrical contact window.

3. The method of claim 2, further comprising:

patterning the top dielectric layer and preserving a portion of the top dielectric layer above the infrared measuring membrane and the electrical contact window.

4. The method of claim 1, further comprising a step of forming a bottom dielectric layer before forming the infrared measuring membrane.

5. The method of claim 4, further comprising:

forming an etching window through the top dielectric layer and the bottom dielectric layer to expose the sacrificial layer; and etching the sacrificial layer.

6. The method of claim 1, further comprising a step of forming a dielectric layer on the reading circuit chip to protect the reading circuit.

7. The method of claim 1, wherein the sacrificial layer is made of polyimide.

8. The method of claim 1, wherein the step of filling is achieved by electroless plating the metal layer into the electrical contact window.

9. The method of claim 8, wherein the metal layer is a nickel layer.

10. The method of claim 1, wherein the method is utilized to manufacture a thermal type infrared sensor.

11. The method of claim 10, wherein the thermal type infrared sensor is a microbolometer.

12. The method of claim 1, wherein the infrared sensor is a microbolometer.

13. A method of enhancing connection strength of suspended membrane leads and substrate contacts of an infrared sensor, comprising:

providing a reading circuit chip that is protected by a dielectric layer;

forming a sacrificial layer on the reading circuit chip;

forming an electrical contact window in the sacrificial layer and the dielectric layer to expose a conductive layer of the reading circuit chip;

filling the electrical contact window with a metal layer;

forming a bottom dielectric layer;

forming a conductive membrane to couple to the metal layer;

forming an infrared measuring membrane on the conductive membrane; and forming a top dielectric layer on the infrared measuring membrane to protect the infrared measuring membrane.

14. The method of claim 13, further comprising:

patterning the infrared measuring membrane and preserving a portion of the infrared measuring membrane above the electrical contact window.

15. The method of claim 14, further comprising:

patterning the top dielectric layer and preserving a portion of the top dielectric layer above the infrared measuring membrane and the electrical contact window.

16. The method of claim 14, further comprising:

forming an etching window through the top dielectric layer and the bottom dielectric layer to expose the sacrificial layer; and etching the sacrificial layer.

17. The method of claim 13, wherein the step of filling is achieved by electroless plating the metal layer into the electrical contact window.

18. The method of claim 17, wherein the metal layer is a nickel layer.

* * * * *